United States Patent
Tsuji

(10) Patent No.: US 12,339,183 B2
(45) Date of Patent: Jun. 24, 2025

(54) PRESSURE SENSOR INCLUDING A PRESSURE SENSOR CHIP TO DETECT A DIFFERENTIAL PRESSURE WITH HIGH ACCURACY

(71) Applicant: Murata Manufacturing Co., Ltd., Nagaokakyo (JP)

(72) Inventor: Daiki Tsuji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 318 days.

(21) Appl. No.: 18/125,791

(22) Filed: Mar. 24, 2023

(65) Prior Publication Data

US 2023/0228639 A1 Jul. 20, 2023

Related U.S. Application Data

(63) Continuation of application No. PCT/JP2021/032694, filed on Sep. 6, 2021.

(30) Foreign Application Priority Data

Oct. 12, 2020 (JP) ................................. 2020-171848

(51) Int. Cl.
*G01L 13/06* (2006.01)
*B81B 3/00* (2006.01)

(52) U.S. Cl.
CPC ............ *G01L 13/06* (2013.01); *B81B 3/0072* (2013.01); *B81B 2201/0264* (2013.01);
(Continued)

(58) Field of Classification Search
None
See application file for complete search history.

(56) References Cited

U.S. PATENT DOCUMENTS 6,374,680 B1 4/2002 Drewes et al.
9,726,561 B2 * 8/2017 Besling ................. G01L 13/025
(Continued)

FOREIGN PATENT DOCUMENTS

JP 06201419 A 7/1994
JP 2001013026 A 1/2001
(Continued)

OTHER PUBLICATIONS

International Search Report in PCT/JP2021/032694, mailed Oct. 26, 2021, 3 pages.
(Continued)

*Primary Examiner* — Peter J Macchiarolo
*Assistant Examiner* — Jermaine L Jenkins
(74) *Attorney, Agent, or Firm* — Keating & Bennett, LLP

(57) ABSTRACT

A pressure sensor chip includes a third conductive layer, a second insulating layer, a first conductive layer, a first insulating layer, and a second conductive layer stacked in order. The first insulating layer includes first and second cavities communicating externally. The second insulating layer includes third and fourth cavities respectively communicating with the second and first cavities. The first conductive layer includes first and second diaphragms, the second conductive layer includes first and second electrodes, and the third conductive layer includes third and fourth electrodes. The first diaphragm and the first electrode face each other with the cavity interposed therebetween, the second diaphragm and the electrode face each other with the first cavity interposed therebetween, the first diaphragm and the third electrode face each other with the fourth cavity interposed therebetween, and the second diaphragm and the fourth electrode face each other with the fourth cavity interposed therebetween.

20 Claims, 13 Drawing Sheets

(52) U.S. Cl.
CPC ... *B81B 2203/0136* (2013.01); *B81B 2203/04* (2013.01); *B81B 2207/012* (2013.01)

(56) References Cited

U.S. PATENT DOCUMENTS

| | | | | |
|---|---|---|---|---|
| 11,299,392 | B2* | 4/2022 | Achehboune | H04R 19/04 |
| 11,540,048 | B2* | 12/2022 | Loeppert | H04R 19/04 |
| 11,733,114 | B2* | 8/2023 | Mori | G01L 1/146 |
| | | | | 73/862.041 |
| 11,767,218 | B2* | 9/2023 | Pernu | G01L 19/02 |
| | | | | 73/727 |
| 11,827,511 | B2* | 11/2023 | Loeppert | B81B 3/0059 |
| 2010/0199778 | A1 | 8/2010 | Hegner et al. | |
| 2017/0315008 | A1 | 11/2017 | Teipen et al. | |
| 2018/0074090 | A1* | 3/2018 | Boysel | G01D 21/02 |
| 2022/0048761 | A1 | 2/2022 | Pernu et al. | |

FOREIGN PATENT DOCUMENTS

| | | | |
|---|---|---|---|
| JP | 2010538242 | A | 12/2010 |
| WO | 2020053485 | A1 | 3/2020 |

OTHER PUBLICATIONS

Written Opinion in PCT/JP2021/032694, mailed Oct. 26, 2021, 3 pages.

\* cited by examiner

PRESSURE SENSOR INCLUDING A PRESSURE SENSOR CHIP TO DETECT A DIFFERENTIAL PRESSURE WITH HIGH ACCURACY

CROSS REFERENCE TO RELATED APPLICATIONS

This application claims the benefit of priority to Japanese Patent Application No. 2020-171848 filed on Oct. 12, 2020 and is a Continuation Application of PCT Application No. PCT/JP2021/032694 filed on Sep. 6, 2021. The entire contents of each application are hereby incorporated herein by reference.

BACKGROUND OF THE INVENTION

1. Field of the Invention

The present invention relates to a pressure sensor chip for measuring an external pressure, and a pressure sensor including the pressure sensor chip.

2. Description of the Related Art

A known pressure sensor detects an external pressure. Various types of influence exerted on the pressure sensor may cause an error in a detected pressure. Examples of such influence include impact applied to the pressure sensor from outside, a change in elasticity due to deterioration caused by aging of a material forming the pressure sensor, and the like.

In order to solve the above-described problem, in a pressure sensor disclosed in Japanese Unexamined Patent Application Publication No. 6-201419, a space on a front surface side of one film of two films that are deformed in accordance with an applied pressure and a space on a rear surface side of another film of the two films are made to communicate with each other. In addition, in the pressure sensor, a space on a rear surface side of the one film and a space on a front surface side of the other film are made to communicate with each other. Thus, when pressure is applied to the two films, the two films are deformed in directions opposite to each other, and accordingly an error in a detected pressure caused by the above-described various types of influence is canceled out and reduced.

As one type of pressure sensor, a capacitive differential pressure sensor capable of measuring a differential pressure between two pressures has been known. Such a differential pressure sensor includes a first conductive layer in which two diaphragms (a first diaphragm and a second diaphragm) are formed, and a second conductive layer facing the first conductive layer. A differential pressure between two pressures is detected by subtracting a capacitance value between the second diaphragm and the second conductive layer from a capacitance value between the first diaphragm and the second conductive layer.

When a configuration of the pressure sensor disclosed in Japanese Unexamined Patent Application Publication No. 6-201419 is applied to such a differential pressure sensor, a first pressure is applied to the first diaphragm from a side of the second conductive layer, and a second pressure is applied to the first diaphragm from an opposite side from the second conductive layer. In addition, the second pressure is applied to the second diaphragm from the side of the second conductive layer, and the first pressure is applied to the second diaphragm from the opposite side from the second conductive layer. Accordingly, since the first diaphragm and the second diaphragm are bent in directions opposite to each other, similar effects as those of the pressure sensor disclosed in Japanese Unexamined Patent Application Publication No. 6-201419 can be obtained. However, problems described below may occur.

A material forming the differential pressure sensor may be warped or solidified due to a change in temperature. The change in temperature occurs when a process of rapidly increasing or decreasing temperature is performed when manufacturing the differential pressure sensor, when a reflow process is performed when mounting the manufactured differential pressure sensor on a substrate, or the like. In addition, an elastic modulus of the material forming the differential pressure sensor may change due to moisture absorption or the like.

When the first conductive layer (the first diaphragm and the second diaphragm) of the differential pressure sensor is warped, solidified, or changed in elastic modulus as described above, stress is applied to the first conductive layer. When the stress affects the bending of the first diaphragm and the second diaphragm, an error may occur in each capacitance value. This may result in an error becoming greater in a detected differential pressure.

SUMMARY OF THE INVENTION

Preferred embodiments of the present invention provide pressure sensor chips each able to detect a differential pressure with high accuracy.

A pressure sensor chip according to a preferred embodiment of the present invention includes a first insulating layer including a first cavity and a second cavity, and being electrically insulated, a second insulating layer including a third cavity and a fourth cavity, and being electrically insulated, a first conductive layer between the first insulating layer and the second insulating layer, a second conductive layer joined to the first insulating layer on an opposite side from the first conductive layer, a third conductive layer joined to the second insulating layer on an opposite side from the first conductive layer, a first flow path through which the first cavity and the fourth cavity communicate with each other, a second flow path through which the second cavity and the third cavity communicate with each other, a first communication portion through which at least one of the first cavity and the fourth cavity communicates externally, and a second communication portion through which at least one of the second cavity and the third cavity communicates externally, wherein the first conductive layer includes a first diaphragm between the first cavity and the third cavity, and a second diaphragm between the second cavity and the fourth cavity, the second conductive layer includes a first electrode facing the first diaphragm with the first cavity interposed therebetween, and a second electrode facing the second diaphragm with the second cavity interposed therebetween, and the third conductive layer includes a third electrode facing the first diaphragm with the third cavity interposed therebetween, and a fourth electrode facing the second diaphragm with the fourth cavity interposed therebetween.

According to preferred embodiments of the present invention, a differential pressure is able to be detected with high accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
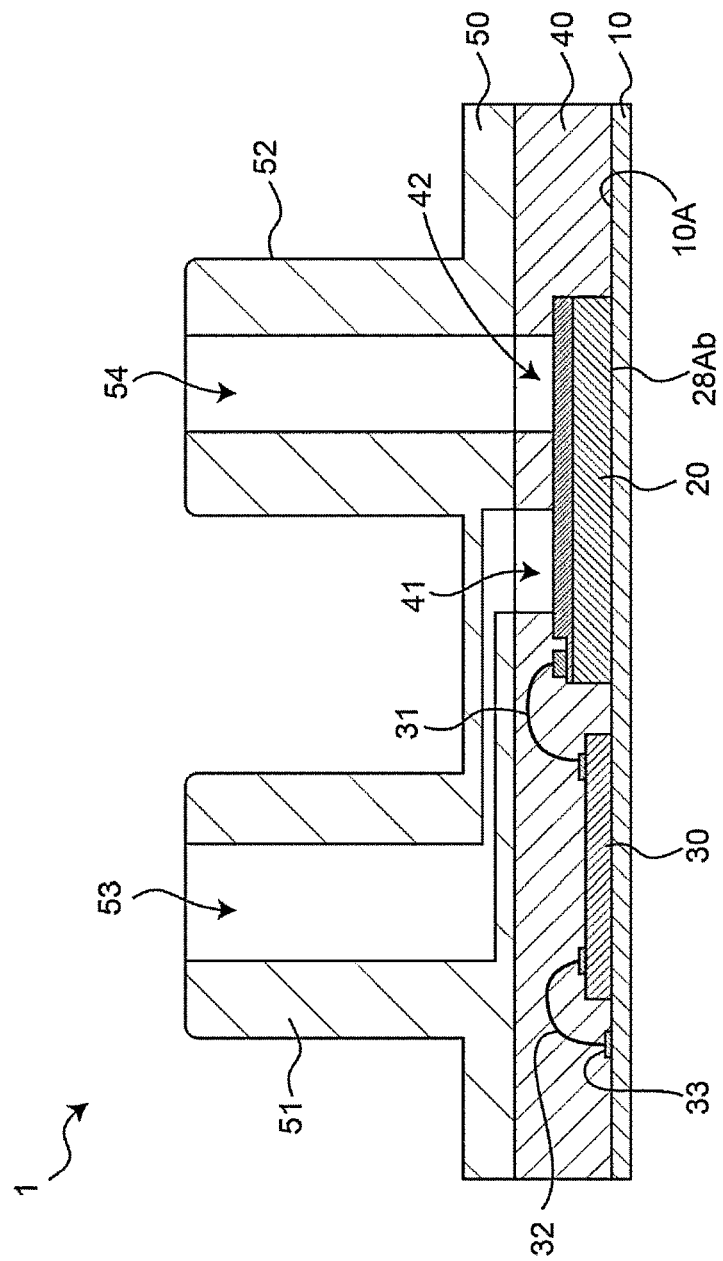
FIG. 1 is a longitudinal sectional view of a pressure sensor according to a first preferred embodiment of the present invention.

Preferred embodiments of the present invention will be described below with reference to the drawings.

A pressure sensor chip according to a preferred embodiment of the present invention includes a first insulating layer including a first cavity and a second cavity, and being electrically insulated, a second insulating layer including a third cavity and a fourth cavity, and being electrically insulated, a first conductive layer between the first insulating layer and the second insulating layer, a second conductive layer joined to the first insulating layer on an opposite side from the first conductive layer, a third conductive layer joined to the second insulating layer on an opposite side from the first conductive layer, a first flow path through which the first cavity and the fourth cavity communicate with each other, a second flow path through which the second cavity and the third cavity communicate with each other, a first communication portion through which at least one of the first cavity and the fourth cavity communicates externally, and a second communication portion through which at least one of the second cavity and the third cavity communicates externally, wherein the first conductive layer includes a first diaphragm between the first cavity and the third cavity, and a second diaphragm between the second cavity and the fourth cavity, the second conductive layer includes a first electrode facing the first diaphragm with the first cavity interposed therebetween, and a second electrode facing the second diaphragm with the second cavity interposed therebetween, and the third conductive layer includes a third electrode facing the first diaphragm with the third cavity interposed therebetween, and a fourth electrode facing the second diaphragm with the fourth cavity interposed therebetween.

According to this configuration, four capacitance values can be read by respective capacitors defined by the first cavity, the second cavity, the third cavity, and the fourth cavity. A capacitance value (first capacitance value) corresponding to pressure applied from outside via the first communication portion (a first pressure) can be detected by adding respective capacitance values of the first cavity and the fourth cavity communicating with each other by the first flow path. Similarly, a capacitance value (second capacitance value) corresponding to pressure applied from outside via the second communication portion (a second pressure) can be detected by adding respective capacitance values of the second cavity and the third cavity communicating with each other by the second flow path. A differential pressure between the first pressure and the second pressure can be obtained based on a difference between the first capacitance value and the second capacitance value.

Pressure applied to the first diaphragm of the first conductive layer from outside via the first cavity is applied from a side of the first insulating layer. Pressure applied to the second diaphragm of the first conductive layer from outside via the fourth cavity is applied from a side of the second insulating layer. Here, stress applied to the first conductive layer due to warpage or the like includes a compressive stress and a tensile stress. One of the compressive stress and the tensile stress is applied to a surface of the first conductive layer on the first insulating layer side, and another of the compressive stress and the tensile stress is applied to a surface of the first conductive layer on the second insulating layer side. Thus, a capacitance value of the first cavity is influenced by the one of the compressive stress and the tensile stress, and a capacitance value of the fourth cavity is influenced by the other of the compressive stress and the tensile stress. Thus, when the capacitance value of the first cavity and the capacitance value of the fourth cavity are added, at least a portion of the stress (the compressive stress and the tensile stress) influencing the respective capacitance values is cancelled.

Also, for the second cavity and the third cavity, similar to the first cavity and the fourth cavity, a capacitance value of the second cavity is influenced by one of the compressive stress and the tensile stress, and a capacitance value of the third cavity is influenced by another of the compressive stress and the tensile stress. Thus, when the capacitance value of the second cavity and the capacitance value of the third cavity are added, at least a portion of the stress (the compressive stress and the tensile stress) influencing the respective capacitance values is cancelled.

As a result, since the influence of the stress applied to the first conductive layer can be reduced, an error of a detected capacitance value can be reduced.

In plan view of the first conductive layer, the first diaphragm and the second diaphragm may have the same or substantially the same area.

A thickness of the first insulating layer and a thickness of the second insulating layer are the same or substantially the same.

According to these configurations, variations in the influence of the stress affecting the respective capacitance values of the first cavity, the second cavity, the third cavity, and the fourth cavity are reduced. Thus, it is possible to increase an amount of cancellation of the stress.

A pressure sensor chip according to a preferred embodiment of the present invention may include a first pad electrically connected to the first electrode, a second pad electrically connected to the second electrode, a third pad electrically connected to the third electrode, a fourth pad electrically connected to the fourth electrode, and a fifth pad electrically connected to the first diaphragm and the second diaphragm. According to this configuration, capacitance values of the respective cavities can be detected based on values of currents flowing through the respective pads or values of voltage applied between the pads.

A pressure sensor chip according to a preferred embodiment of the present invention may include a first pad electrically connected to the first electrode and the fourth electrode, a second pad electrically connected to the second electrode and the third electrode, a third pad electrically connected to the first diaphragm, and a fourth pad electrically connected to the second diaphragm. According to this configuration, capacitance values of the respective cavities can be detected based on values of currents flowing through the respective pads or values of voltage applied between the pads. Further, according to this configuration, since one pad is connected to two electrodes, it is possible to reduce the number of electrodes, as compared to a configuration in which one pad is connected to one electrode.

The first flow path may include a first through-hole provided in the first conductive layer, a first space provided in the first insulating layer, and communicating with the first through-hole and the first cavity, and a second space provided in the second insulating layer and communicating with the first through-hole and the fourth cavity. According to this configuration, it is possible to provide the first flow path without requiring a complicated configuration or a complicated manufacturing process.

The second flow path may include a second through-hole provided in the first conductive layer, a third space provided in the first insulating layer, and communicating with the second through-hole and the second cavity, and a fourth space provided in the second insulating layer and communicating with the second through-hole and the third cavity. According to this configuration, it is possible to provide the second flow path without requiring a complicated configuration or a complicated manufacturing process.

The second conductive layer may be exposed externally and may include the first communication portion and the second communication portion. According to this configuration, the first communication portion and the second communication portion can be provided without requiring a complicated configuration.

A pressure sensor chip according to a preferred embodiment of the present invention may include a first base portion including at least one layer, and joined to the second conductive layer on an opposite side from the first insulating layer, and a second base portion including at least one layer, and joined to the third conductive layer on an opposite side from the second insulating layer, and the first base portion and the second base portion may be configured to be symmetrical to each other with respect to the first conductive layer. According to this configuration, the pressure sensor chip is configured symmetrically in a stacking direction of the respective layers. Thus, warpage of the pressure sensor chip can be reduced or prevented. As a result, the occurrence of stress in the first conductive layer can be reduced or prevented.

At least one of the first base portion and the second base portion may include a conductive layer. According to this configuration, each layer can be shielded by the base portion including the conductive layer. Accordingly, since noise to each layer can be reduced, accuracy of a detected capacitance value is improved.

A pressure sensor according to a preferred embodiment of the present invention includes the pressure sensor chip, and a control chip electrically connected to the first electrode, the second electrode, the third electrode, the fourth electrode, the first diaphragm, and the second diaphragm, wherein the control chip is configured or programmed to calculate a differential pressure between pressure applied to the first diaphragm and pressure applied to the second diaphragm, based on signals from the first electrode, the second electrode, the third electrode, the fourth electrode, the first diaphragm, and the second diaphragm.

According to this configuration, in the pressure sensor including the pressure sensor chip, it is possible to cancel at least a portion of stress (a compressive stress and a tensile stress) influencing each of them.

First Preferred Embodiment

FIG. 1 is a longitudinal sectional view of a pressure sensor according to a first preferred embodiment of the present invention.

As illustrated in FIG. 1, a pressure sensor 1 includes a substrate 10, a pressure sensor chip 20, an application specific integrated circuit (ASIC) 30, a first covering portion 40, and a second covering portion 50. Hereinafter, the application specific integrated circuit 30 will be referred to as an ASIC 30. The ASIC 30 is an example of a control chip.

The substrate 10 is a plate-shaped member. The substrate 10 is made of a material such as resin, for example, epoxy resin or phenol resin, ceramic, or aluminum. A wiring pattern, a pad, a through-hole, and the like made of metal such as copper, for example, are provided on an outer surface of the substrate 10. The wiring pattern, the pad, and the through-hole may be electrically connected to each other.

The pressure sensor chip 20 senses a minute pressure. The pressure sensor chip 20 includes two diaphragms (a first diaphragm 21B and a second diaphragm 21C, see FIG. 2 and FIG. 3) to be described later. The first diaphragm 21B and the second diaphragm 21C each sense pressure by being bent. That is, the pressure sensor 1 is capable of measuring two pressures.

The pressure sensor chip 20 is mounted on an upper surface 10A of the substrate 10. As a mounting method, various known methods can be used. In the first preferred embodiment, the pressure sensor chip 20 is mounted on the substrate 10 by a base portion 28 (see FIG. 2 and FIG. 3), which will be described later, being adhered to the upper surface 10A with an adhesive.

In the first preferred embodiment, an outer shape of the pressure sensor chip 20 is a rectangular or substantially rectangular parallelepiped shape. The pressure sensor chip 20 may have a shape other than a rectangular or substantially rectangular parallelepiped shape, for example, a cylindrical or substantially cylindrical shape. The pressure sensor chip 20 is a device configured by MEMS (Micro Electro Mechanical Systems). The pressure sensor chip 20 has a structure in which a plurality of layers are stacked. A configuration of the pressure sensor chip 20 will be described in detail later.

The ASIC 30 is mounted on the upper surface 10A of the substrate 10. As a mounting method, various known methods can be used. In the first preferred embodiment, the ASIC 30 is adhered to the upper surface 10A by an adhesive.

The ASIC 30 is connected to the pressure sensor chip 20 by using a plurality of conductive wires (for example, a wire 31 illustrated in FIG. 1) made of, for example, aluminum or copper. The ASIC 30 is electrically connected to a plurality of pads 33 provided on the outer surface of the substrate 10 by using a plurality of conductive wires 32 made of, for example, aluminum or copper. FIG. 1 illustrates only one wire 31 and one wire 32, and only one pad 33.

In the first preferred embodiment, the pressure sensor 1 includes five wires 32. End portions of the respective five wires 32 are connected to respective pads 29A to 29E (see FIG. 3 and FIG. 4) to be described later. Other end portions of the respective five wires 32 are connected to the respective pads 33.

The ASIC 30 has a function of processing a signal inputted from the pressure sensor chip 20 through the wire 31 and outputting the processed signal outside through the wire 32. This function will be described in detail later.

The first covering portion 40 and the second covering portion 50 are made of resin such as an epoxy resin, for example.

The first covering portion 40 covers the upper surface 10A of the substrate 10, the pressure sensor chip 20, the ASIC 30, the wires 31 and 32. The first covering portion 40 includes two cavities 41 and 42. The cavity 41 exposes a portion of the pressure sensor chip 20 (specifically, an electrode 22B described later) externally. The cavity 42 exposes a portion of the pressure sensor chip 20 (specifically, an electrode 22C described later) externally.

The second covering portion 50 is joined to the first covering portion 40. The second covering portion 50 is joined to the first covering portion 40 on an opposite side from a side where the first covering portion 40 is in contact with the pressure sensor chip 20. The second covering portion 50 includes two cylindrical caps 51 and 52. The caps 51 and 52 protrude away from the first covering portion 40 and the pressure sensor chip 20. An internal space 53 of the cap 51 communicates with the cavity 41. An internal space 54 of the cap 52 communicates with the cavity 42.

Hereinafter, the configuration of the pressure sensor chip 20 will be described in detail. In the following description, directions of respective sides of the pressure sensor chip 20 being rectangular or substantially rectangular parallelepiped are defined as a longitudinal direction 2, a transverse direction 3, and a height direction 4, respectively.

Figure 2:
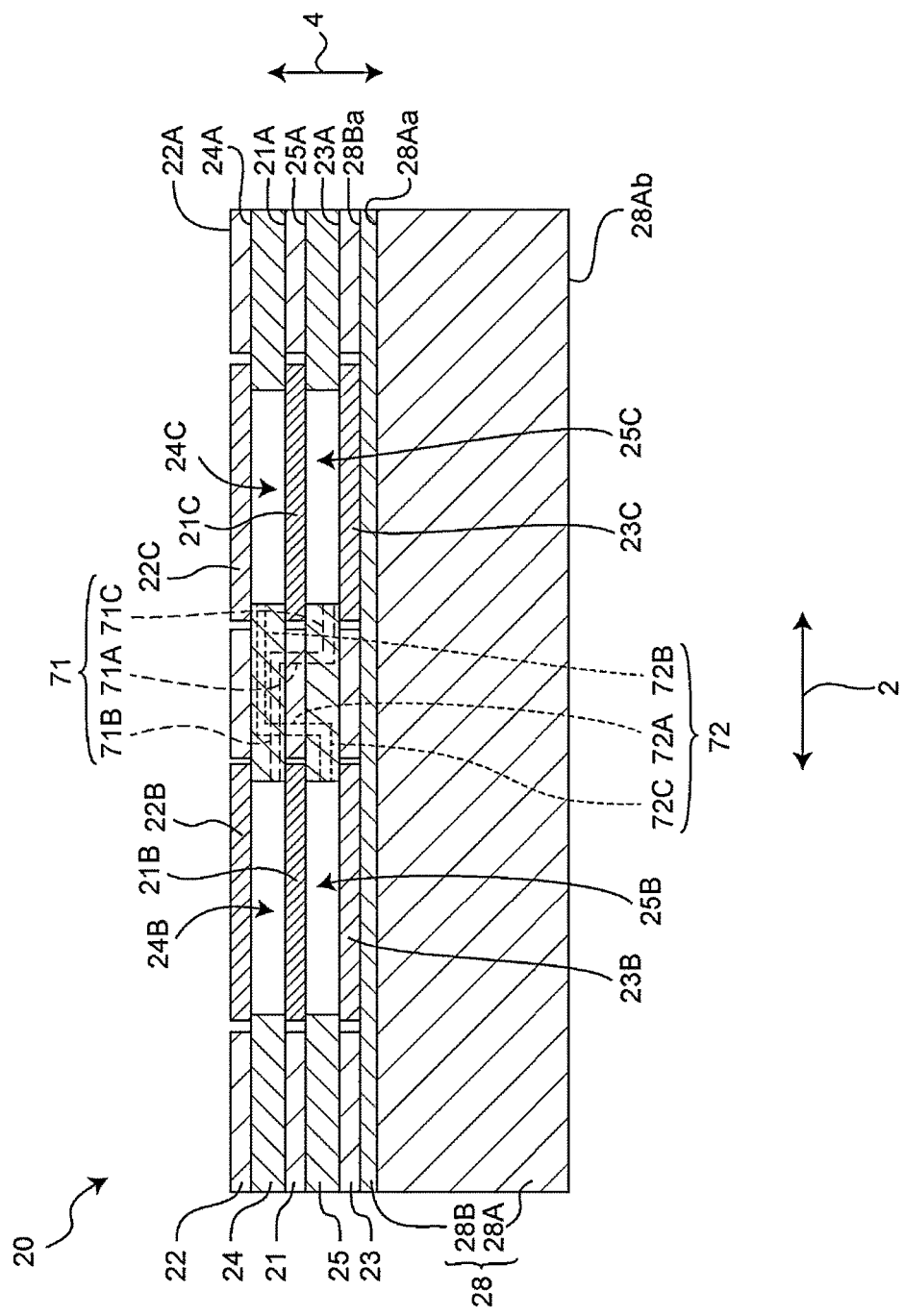
FIG. 2 is a longitudinal sectional view of a pressure sensor chip included in the pressure sensor according to the first preferred embodiment of the present invention.
Figure 3:
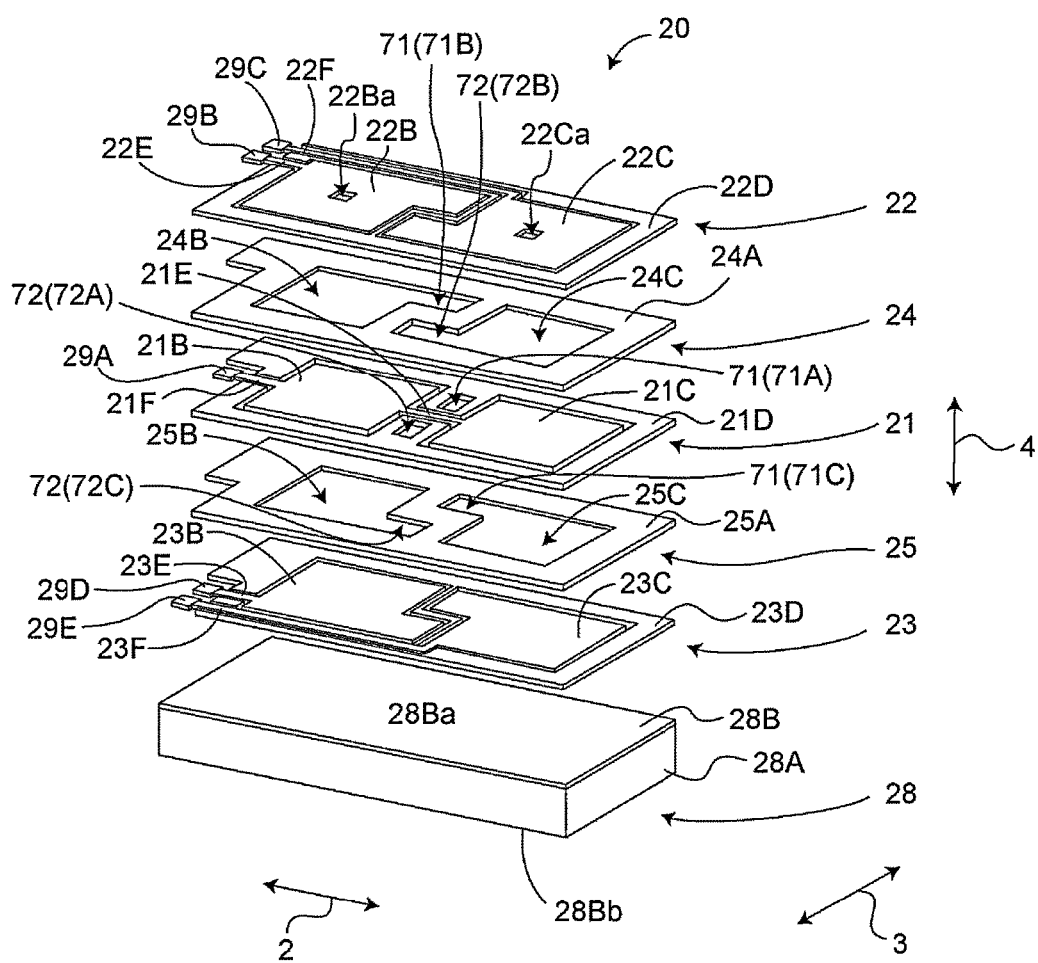
FIG. 3 is an exploded perspective view of the pressure sensor chip included in the pressure sensor according to the first preferred embodiment of the present invention.
Figure 4:
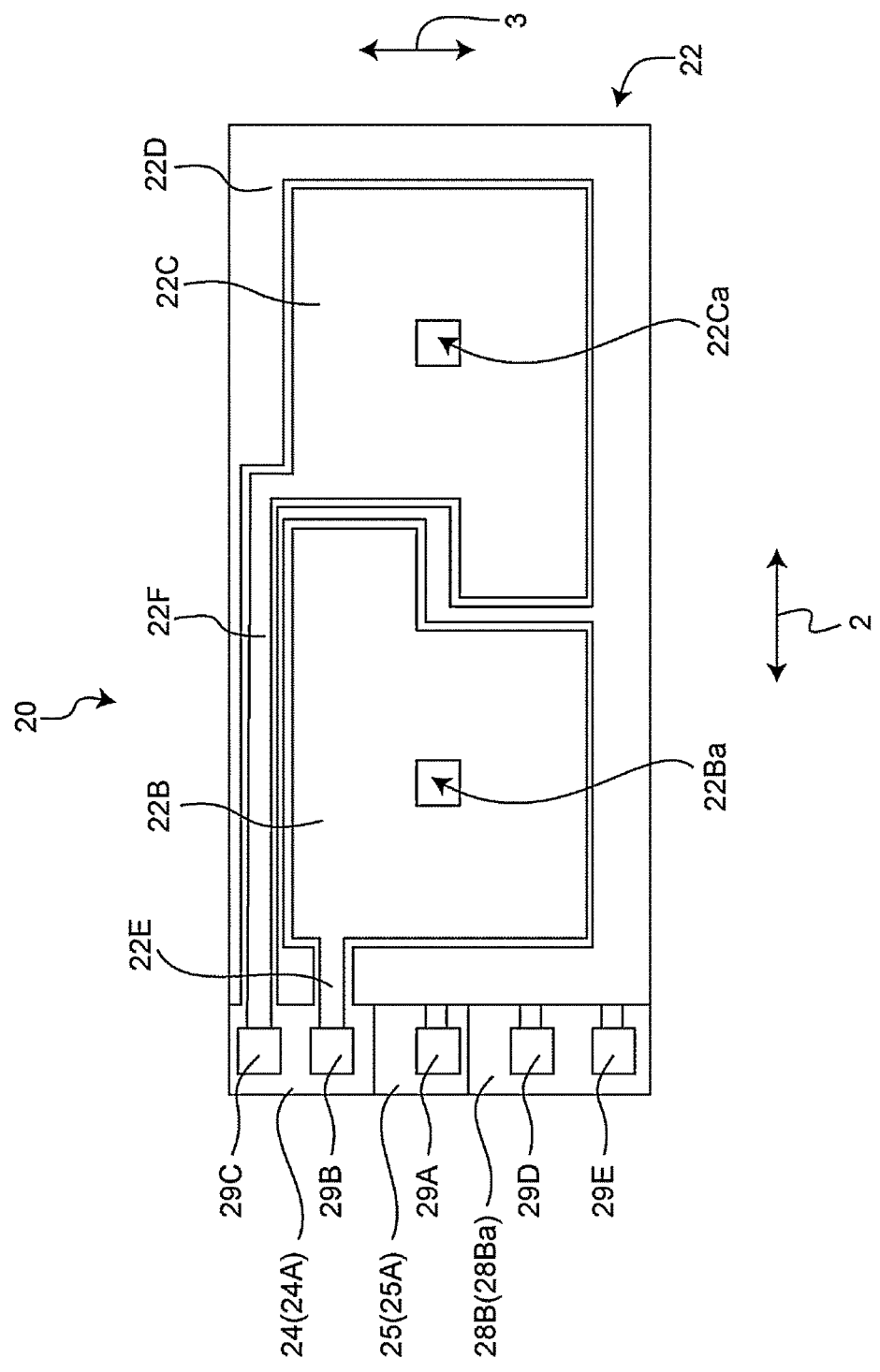
FIG. 4 is a plan view of the pressure sensor chip included in the pressure sensor according to the first preferred embodiment of the present invention.

FIG. 2 is a longitudinal sectional view of the pressure sensor chip included in the pressure sensor according to the first preferred embodiment of the present invention. FIG. 3 is an exploded perspective view of the pressure sensor chip included in the pressure sensor according to the first preferred embodiment of the present invention. FIG. 4 is a plan view of the pressure sensor chip included in the pressure sensor according to the first preferred embodiment of the present invention. In FIG. 2, the transverse direction 3 is a depth direction of a surface of paper of FIG. 2. As illustrated in FIG. 2, in the height direction 4, a side of the base portion 28 is defined as a lower side, and a side of a second conductive layer 22 is defined as an upper side.

As illustrated in FIG. 2 to FIG. 4, the pressure sensor chip 20 includes three conductive layers (a first conductive layer 21, the second conductive layer 22, and a third conductive layer 23), two insulating layers (a first insulating layer 24 and a second insulating layer 25), the base portion 28, and the five pads 29A to 29E.

The first conductive layer 21, the second conductive layer 22, and the third conductive layer 23 are conductors. In the first preferred embodiment, the first conductive layer 21, the second conductive layer 22, and the third conductive layer 23 are made of, for example, silicon.

The first insulating layer 24 and the second insulating layer 25 are electrically insulated insulators. In the first preferred embodiment, the first insulating layer 24 and the second insulating layer 25 are made of, for example, silicon dioxide.

As illustrated in FIG. 2 and FIG. 3, the base portion 28 includes a conductive layer 28A and an insulating layer 28B. The conductive layer 28A is a conductor. In the first preferred embodiment, the conductive layer 28A is made of, for example, silicon similarly to the first conductive layer 21 and the like. The insulating layer 28B is an electrically insulated insulator. The insulating layer 28B is made of, for example, silicon dioxide similarly to the first insulating layer 24 and the like.

As illustrated in FIG. 2, the conductive layer 28A is joined to the upper surface 10A of the substrate 10 (see FIG. 1). The insulating layer 28B is joined to an upper surface 28Aa of the conductive layer 28A. The third conductive layer 23 is joined to an upper surface 28Ba of the insulating layer 28B. The second insulating layer 25 is joined to an upper surface 23A of the third conductive layer 23. The first conductive layer 21 is joined to an upper surface 25A of the second insulating layer 25. The first insulating layer 24 is joined to an upper surface 21A of the first conductive layer 21. The second conductive layer 22 is joined to an upper surface 24A of the first insulating layer 24.

The first conductive layer 21 is sandwiched between the first insulating layer 24 and the second insulating layer 25. The second conductive layer 22 is joined to a surface of the first insulating layer 24 on an opposite side from the first conductive layer 21. The third conductive layer 23 is joined to a surface of the second insulating layer 25 on an opposite side from the first conductive layer 21.

As described above, in the pressure sensor chip 20, the base portion 28, the third conductive layer 23, the second insulating layer 25, the first conductive layer 21, the first insulating layer 24, and the second conductive layer 22 are stacked in order from the bottom.

In the first preferred embodiment, a thickness (length in the height direction 4) of each of the first conductive layer 21, the second conductive layer 22, and the third conductive layer 23 is the same or substantially the same. In the first preferred embodiment, the first insulating layer 24 and the second insulating layer 25 have the same or substantially the same thickness. In the first preferred embodiment, the thickness of each of the first insulating layer 24 and the second insulating layer 25 is larger than the thickness of each of the first conductive layer 21, the second conductive layer 22, and the third conductive layer 23.

The first conductive layer 21, the second conductive layer 22, and the third conductive layer 23 need not be completely the same and may be substantially the same in thickness. Further, the first conductive layer 21, the second conductive layer 22, and the third conductive layer 23 may have different thicknesses from each other. Further, the first insulating layer 24 and the second insulating layer 25 need not be completely the same and may be substantially the same in thickness. Further, the first insulating layer 24 and the second insulating layer 25 may have different thicknesses from each other. Further, the thickness of each of the first insulating layer 24 and the second insulating layer 25 may be equal to or less than the thickness of each of the first conductive layer 21, the second conductive layer 22, and the third conductive layer 23.

As illustrated in FIG. 1, portions of the pressure sensor chip 20 except for a lower surface thereof (specifically, a lower surface 28Ab of the conductive layer 28A of the base portion 28 joined to the substrate 10) are covered by the first covering portion 40.

As illustrated in FIG. 2 and FIG. 3, cavities 24B and 24C are provided in the first insulating layer 24. The cavity 24B is an example of a first cavity. The cavity 24C is an example of a second cavity. Cavities 25B and 25C are provided in the second insulating layer 25. The cavity 25B is an example of a third cavity. The cavity 25C is an example of a fourth cavity. In the first preferred embodiment, each of the cavities 24B, 24C, 25B, and 25C has a rectangular or substantially rectangular shape in plan view when the pressure sensor chip 20 is viewed from above but may have a shape other than a rectangular or substantially rectangular shape (for example, a circular or substantially circular shape).

As illustrated in FIG. 3, the first conductive layer 21 includes a first diaphragm 21B, a second diaphragm 21C, an outer peripheral portion 21D, communication portions 21E and 21F. The outer peripheral portion 21D surrounds, in plan view, the first diaphragm 21B, the second diaphragm 21C, the communication portions 21E and 21F.

The first diaphragm 21B and the second diaphragm 21C are electrically connected to each other with the communication portion 21E interposed therebetween. The first diaphragm 21B is electrically connected to the pad 29A with the communication portion 21F interposed therebetween. That is, the first diaphragm 21B, the second diaphragm 21C, and the pad 29A are electrically connected to each other. The pad 29A is supported by the upper surface 25A of the second insulating layer 25. The pad 29A is an example of a fifth pad. Gaps are provided between the outer peripheral portion 21D, and the first diaphragm 21B, the second diaphragm 21C, and the communication portions 21E and 21F.

As illustrated in FIG. 2, the first diaphragm 21B is sandwiched between the cavity 24B of the first insulating layer 24 and the cavity 25B of the second insulating layer 25. The second diaphragm 21C is sandwiched between the cavity 24C of the first insulating layer 24 and the cavity 25C of the second insulating layer 25.

As illustrated in FIG. 3, in plan view, the first diaphragm 21B and the second diaphragm 21C have the same or substantially the same shape and area. In plan view, the first diaphragm 21B and the second diaphragm 21C need not be completely the same and may have substantially the same shape. In addition, in plan view, the first diaphragm 21B and the second diaphragm 21C need not be completely the same and may have substantially the same area. In addition, in plan view, the first diaphragm 21B and the second diaphragm 21C may have different shapes and/or areas.

As illustrated in FIG. 2, the second conductive layer 22 is located uppermost in the pressure sensor chip 20. Thus, an upper surface 22A of the second conductive layer 22 is exposed outside the pressure sensor chip 20.

As illustrated in FIG. 3 and FIG. 4, the second conductive layer 22 includes the electrodes 22B and 22C, an outer peripheral portion 22D, and communication portions 22E and 22F. The outer peripheral portion 22D surrounds, in plan view, the electrodes 22B and 22C and the communication portions 22E and 22F. The electrode 22B is an example of a first electrode. The electrode 22C is an example of a second electrode.

The electrode 22B is electrically connected to a pad 29B with the communication portion 22E interposed therebetween. That is, the electrode 22B and the pad 29B are electrically connected to each other. The electrode 22C is electrically connected to a pad 29C with the communication portion 22F interposed therebetween. That is, the electrode 22C and the pad 29C are electrically connected to each other. The pads 29B and 29C are supported by the upper surface 24A of the first insulating layer 24. The pad 29B is an example of a first pad. The pad 29C is an example of a second pad. Gaps are provided between the outer peripheral portion 22D, and the electrode 22B and the communication portion 22E, and between the outer peripheral portion 22D, and the electrode 22C and the communication portion 22F. The electrode 22B and the communication portion 22E are separated from the electrode 22C and the communication portion 22F with the outer peripheral portion 22D interposed therebetween.

As illustrated in FIG. 2, the electrode 22B faces the first diaphragm 21B with the cavity 24B interposed therebetween. The electrode 22C faces the second diaphragm 21C with the cavity 24C interposed therebetween.

As illustrated in FIG. 3 and FIG. 4, a through-hole 22Ba is formed in the electrode 22B. A lower end portion of the through-hole 22Ba communicates with the cavity 24B of the first insulating layer 24. An upper end portion of the through-hole 22Ba communicates with the outside of the pressure sensor chip 20. In the first preferred embodiment, the upper end portion of the through-hole 22Ba communicates with the cavity 41 (see FIG. 1) of the first covering portion 40. Thus, the cavity 24B of the first insulating layer 24 communicates with an outside of the pressure sensor 1 through the through-hole 22Ba, the cavity 41, and the internal space 53 (see FIG. 1) of the cap 51. The through-hole 22Ba is an example of a first communication portion.

A through-hole 22Ca is provided in the electrode 22C. A lower end portion of the through-hole 22Ca communicates with the cavity 24C of the first insulating layer 24. An upper end portion of the through-hole 22Ca communicates with the outside of the pressure sensor chip 20. In the first preferred embodiment, the upper end portion of the through-hole 22Ca communicates with the cavity 42 (see FIG. 1) of the first covering portion 40, and thus, the cavity 24C of the first insulating layer 24 communicates with the outside of the pressure sensor 1 through the through-hole 22Ca, the cavity 42, and the internal space 54 (see FIG. 1) of the cap 52. The through-hole 22Ca is an example of a second communication portion.

As illustrated in FIG. 3, the third conductive layer 23 includes electrodes 23B and 23C, an outer peripheral portion 23D, and communication portions 23E and 23F. The outer peripheral portion 23D surrounds, in plan view, the electrodes 23B and 23C, and the communication portions 23E and 22F. The electrode 23B is an example of a third electrode. The electrode 23C is an example of a fourth electrode.

The electrode 23B is electrically connected to the pad 29D with the communication portion 23E interposed therebetween. That is, the electrode 23B and the pad 29D are electrically connected to each other. The electrode 23C is electrically connected to the pad 29E with the communication portions 23F interposed therebetween. That is, the electrode 23C and the pad 29E are electrically connected to each other. The pads 29D and 29E are supported by the upper surface 28Ba of the insulating layer 28B of the base portion 28. The pad 29D is an example of a third pad. The pad 29E is an example of a fourth pad. Gaps are provided between the outer peripheral portion 23D, and the electrode 23B and the communication portion 23E, and between the outer peripheral portion 23D, and the electrode 23C and the communication portion 23F. The electrode 23B and the communication portion 23E are separated from the electrode 23C and the communication portion 23F with the outer peripheral portion 23D interposed therebetween.

As illustrated in FIG. 2, the electrode 23B faces the first diaphragm 21B with the cavity 25B interposed therebetween. The electrode 23C faces the second diaphragm 21C with the cavity 25C interposed therebetween.

As illustrated in FIG. 2, a first flow path 71 and a second flow path 72 are provided inside the pressure sensor chip 20. Through the first flow path 71, the cavity 24B and the cavity 25C communicate with each other. Through the second flow path 72, the cavity 24C and the cavity 25B communicate with each other.

The first flow path 71 includes a through-hole 71A, and spaces 71B and 71C. The through-hole 71A is an example of a first through-hole. The space 71B is an example of a first space. The space 71C is an example of a second space.

As illustrated in FIG. 3, the through-hole 71A is provided in the first conductive layer 21. In the first preferred embodiment, the through-hole 71A is provided between the first diaphragm 21B and the second diaphragm 21C.

The space 71B is provided in the first insulating layer 24. The space 71B communicates with the cavity 24B. In the first preferred embodiment, the space 71B protrudes from the cavity 24B in the longitudinal direction 2. In plan view, the space 71B overlaps the through-hole 71A of the first conductive layer 21. That is, the space 71B communicates with an upper end portion of the through-hole 71A.

The space 71C is provided in the second insulating layer 25. The space 71C communicates with the cavity 25C. In the first preferred embodiment, the space 71C protrudes from the cavity 25C in the longitudinal direction 2. In plan view, the space 71C overlaps the through-hole 71A of the first conductive layer 21. That is, the space 71C communicates with a lower end portion of the through-hole 71A.

As illustrated in FIG. 2, the second flow path 72 includes a through-hole 72A, and spaces 72B and 72C. The through-hole 72A is an example of a second through-hole. The space 72B is an example of a third space. The space 72C is an example of a fourth space.

As illustrated in FIG. 3, the through-hole 72A is provided in the first conductive layer 21. In the first preferred embodiment, the through-hole 72A is provided between the first diaphragm 21B and the second diaphragm 21C. In addition, the through-hole 72A is provided on an opposite side from the through-hole 71A with respect to the communication portion 21E.

The space 72B is provided in the first insulating layer 24. The space 72B communicates with the cavity 24C. In the first preferred embodiment, the space 72B protrudes from the cavity 24C in the longitudinal direction 2. In plan view, the space 72B overlaps the through-hole 72A of the first conductive layer 21. That is, the space 72B communicates with an upper end portion of the through-hole 72A.

The space 72C is provided in the second insulating layer 25. The space 72C communicates with the cavity 25B. In the first preferred embodiment, the space 72C protrudes from the cavity 25B in the longitudinal direction 2. In plan view, the space 72C overlaps the through-hole 72A of the first conductive layer 21. That is, the space 72C communicates with a lower end portion of the through-hole 72A.

The ASIC 30 is connected to the pads 29A to 29E of the pressure sensor chip 20 by the five wires 32. That is, the ASIC 30 is connected to the first diaphragm 21B and the second diaphragm 21C with the pad 29A interposed therebetween. Further, the ASIC 30 is connected to the electrode 22B with the pad 29B interposed therebetween. Further, the ASIC 30 is connected to the electrode 22C with the pad 29C interposed therebetween. Further, the ASIC 30 is connected to the electrode 23B with the pad 29D interposed therebetween. Further, the ASIC 30 is connected to the electrode 23C with the pad 29E interposed therebetween.

Figure 5:
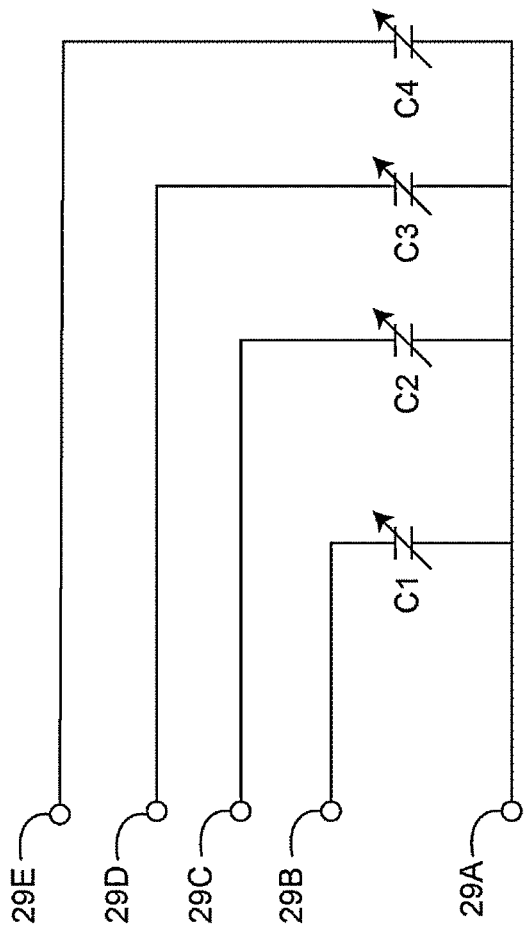
FIG. 5 is a diagram illustrating an equivalent circuit of the pressure sensor chip of FIG. 2.

FIG. 5 is a diagram illustrating an equivalent circuit of the pressure sensor chip of FIG. 2.

As illustrated in FIG. 2, the electrode 22B and the first diaphragm 21B, both of which are conductors, face each other with the cavity 24B interposed therebetween. Thus, a capacitor C1 (see FIG. 5) is defined by the electrode 22B and the first diaphragm 21B. Further, the electrode 22C and the second diaphragm 21C, both of which are conductors, face each other with the cavity 24C interposed therebetween. Thus, a capacitor C2 (see FIG. 5) is defined by the electrode 22C and the second diaphragm 21C. Further, the electrode 23B and the first diaphragm 21B, both of which are conductors, face each other with the cavity 25B interposed therebetween. Thus, a capacitor C3 (see FIG. 5) is defined by the electrode 23B and the first diaphragm 21B. Further, the electrode 23C and the second diaphragm 21C, both of which are conductors, face each other with the cavity 25C interposed therebetween. Thus, a capacitor C4 (see FIG. 5) is defined by the electrode 23C and the second diaphragm 21C. In the case described above, the first diaphragm 21B and the second diaphragm 21C define and function as electrodes of the capacitors.

Figure 6:
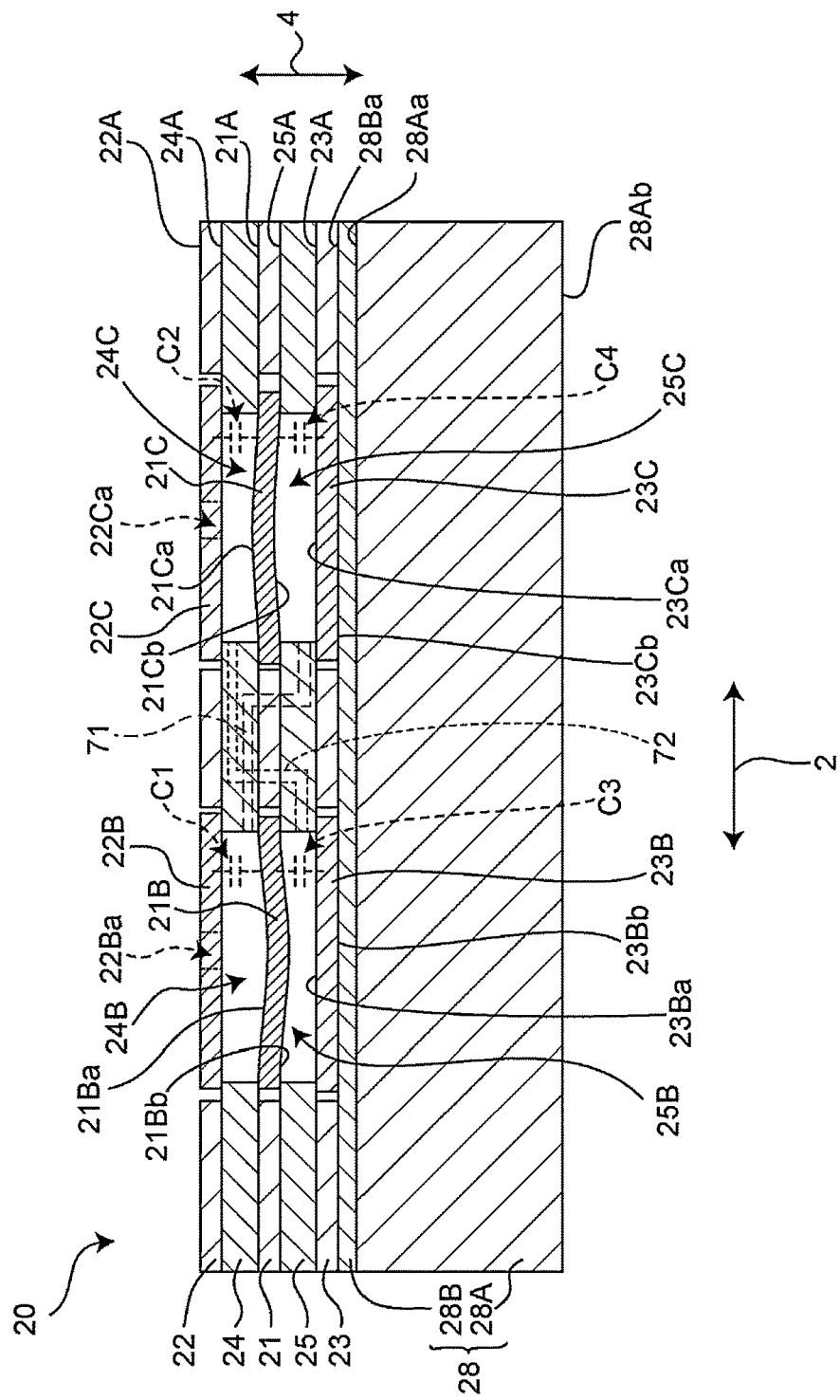
FIG. 6 is a longitudinal sectional view of the pressure sensor chip of FIG. 2 when pressure is applied to a first diaphragm and a second diaphragm.

FIG. 6 is a longitudinal sectional view of the pressure sensor chip when pressure is applied to the first diaphragm 21B and the second diaphragm 21C. In FIG. 6, the above-described capacitors C1 to C4 are indicated by broken lines in a pseudo manner.

When the caps 51 and 52 illustrated in FIG. 1 are each connected to different tubes or the like, fluid at different locations can be taken into the respective caps 51 and 52. For example, it is assumed that pressure due to fluid taken into the internal space 53 of the cap 51 is a pressure P1, and pressure due to fluid taken into the internal space 54 of the cap 52 is a pressure P2.

In this case, as illustrated in FIG. 6, the pressure P1 reaches the cavity 24B from the internal space 53 (see FIG. 1) of the cap 51 via the cavity 41 (see FIG. 1) and the through-hole 22Ba. Further, the pressure P1 reaches the cavity 25C from the cavity 24B via the first flow path 71.

On the other hand, the pressure P2 reaches the cavity 24C from the internal space 54 (see FIG. 1) of the cap 52 via the cavity 42 (see FIG. 1) and the through-hole 22Ca. Further, the pressure P2 reaches the cavity 25B from the cavity 24C via the second flow path 72.

The pressure P1 reaching the cavity 24B is applied to an upper surface 21Ba of the first diaphragm 21B. The pressure P2 reaching the cavity 25B is applied to a lower surface 21Bb of the first diaphragm 21B. The pressure P2 reaching the cavity 24C is applied to an upper surface 21Ca of the second diaphragm 21C. The pressure P1 reaching the cavity 25C is applied to a lower surface 21Cb of the second diaphragm 21C. Here, when P1>P2, as illustrated in FIG. 6, the first diaphragm 21B bends downward, and the second diaphragm 21C bends upward.

In this case, since a distance between the electrodes of each of the capacitors C1 and C4 is increased, as compared to a state (the state illustrated in FIG. 1) in which the capacitors C1 and C4 are not bent since the pressures P1 and P2 are not applied, capacitance values of the capacitors C1 and C4 are decreased as compared to the state illustrated in FIG. 1. On the other hand, since a distance between the electrodes of each of the capacitors C2 and C3 is decreased as compared to the state illustrated in FIG. 1, the capacitance values of the capacitors C2 and C3 are increased as compared to the state illustrated in FIG. 1.

As described above, the ASIC 30 has a function of processing a signal inputted from the pressure sensor chip 20 through the wire 31 and outputting the processed signal outside through the wire 32. Hereinafter, the above function will be described with reference to FIG. 7.

Figure 7:
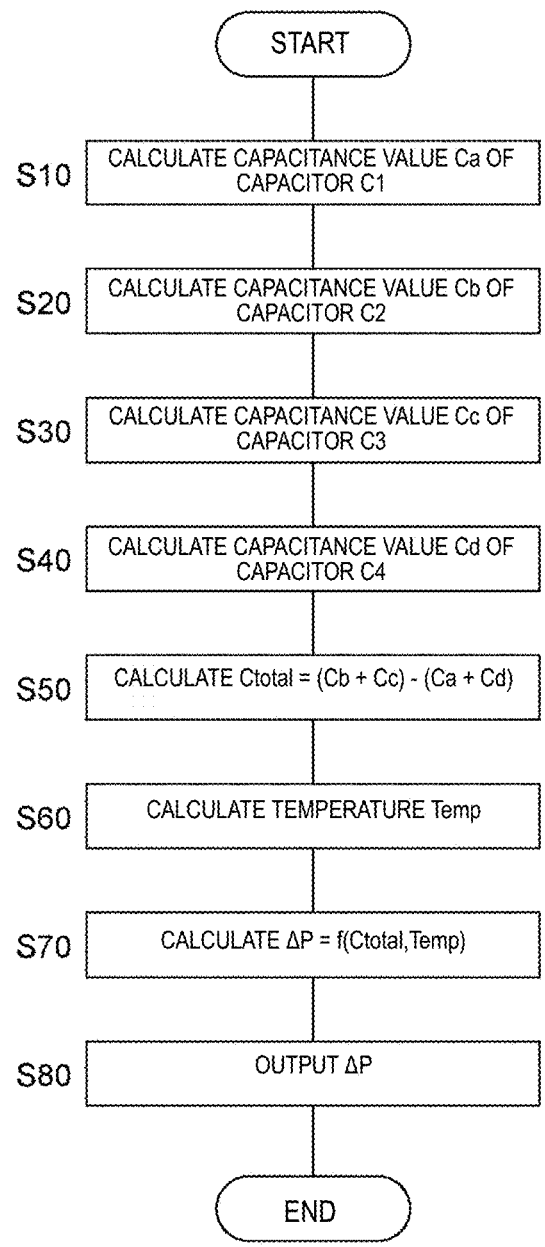
FIG. 7 is a flowchart illustrating a calculation process of calculating a differential pressure value by an ASIC.

FIG. 7 is a flowchart illustrating a calculation process of calculating a differential pressure value by the ASIC. Hereinafter, the above calculation process will be described with reference to FIG. 7.

In steps S10 to S40, the ASIC 30 calculates capacitance values Ca, Cb, Cc, and Cd of the respective capacitors C1, C2, C3, and C4. The capacitance values Ca to Cd of the respective capacitors C1 to C4 are calculated based on currents flowing from the capacitors C1 to C4 to the ASIC 30 through pads 29A to 29E, and voltages between the respective pads 29E to 29A applied to the ASIC 30.

Specifically, the ASIC 30 calculates the capacitance value Ca of the capacitor C1, based on a current flowing between the pads 29A and 29B, and voltage applied between the pads 29A and 29B (S10). The ASIC 30 calculates the capacitance value Cb of the capacitor C2, based on a current flowing between the pads 29A and 29C, and voltage applied between the pads 29A and 29C (S20). The ASIC 30 calculates the capacitance value Cc of the capacitor C3, based on a current flowing between the pads 29A and 29D, and voltage applied between the pads 29A and 29D (S30). The ASIC 30 calculates the capacitance value Cd of the capacitor C4, based on a current flowing between the pads 29A and 29E, and voltage applied between the pads 29A and 29E (S40).

In the first preferred embodiment, the ASIC 30 includes an AD converter circuit therein, and the current values and the voltage values described above inputted to the ASIC 30 are converted from analog values to digital values in the AD converter circuit. In addition, steps S10 to S40 are performed in any order. Further, steps S10 to S40 may be performed in parallel.

Next, the ASIC 30 calculates a differential capacitance value Ctotal from the capacitance values Ca to Cd of the respective capacitors C1 to C4 calculated in steps S10 to S40 based on an equation of $(Cb+Cc)-(Ca+Cd)=Ctotal$ (S50).

Next, the ASIC 30 calculates a temperature Temp of a pressure measurement target based on an input value from a temperature sensor (not illustrated) (S60). In the first preferred embodiment, the measurement target is fluid taken in from the respective caps 51 and 52. The temperature sensor is provided to, for example, a pipe through which the fluid taken in from the caps 51 and 52 flows, or the like. The temperature sensor is connected to the ASIC 30.

When the fluid taken in from the cap 51 is significantly different from the fluid taken in from the cap 52 in temperature, temperature sensors may be provided at both a flow position of the fluid taken in from the cap 51 and a flow position of the fluid taken in from the cap 52. In this case, a plurality of temperatures is calculated.

Next, the ASIC 30 applies the differential capacitance value Ctotal calculated in step S50 and the temperature Temp calculated in step S60 to an equation of $\Delta P=f(Ctotal, Temp)$ to calculate a differential pressure value $\Delta P$ (S70). The function f in the above equation corrects the differential capacitance value Ctotal in accordance with the temperature Temp, in proportion to a predetermined proportionality constant. The correction in accordance with the predetermined proportionality constant and the temperature Temp is appropriately determined based on the configuration such as a size, a material, or the like of the pressure sensor chip 20. The calculation of the differential pressure value $\Delta P$ in step S70 is not limited to calculation by an equation, and may be performed based on, for example, a data table of the differential pressure value $\Delta P$ with respect to each value of the differential capacitance Ctotal, or the like. The data table is stored, for example, in the ASIC 30.

Next, the ASIC 30 outputs the differential pressure value $\Delta P$ calculated in step S70 to an outside of the pressure sensor 1 (for example, a device connected to the pressure sensor 1) through the wire 32 and the substrate 10 (S80).

As described above, based on signals from the electrodes 22B, 22C, 23B, 23C, the first diaphragm 21B, and the second diaphragm 21C, the ASIC 30 calculates the differential pressure between pressure applied to the first diaphragm 21B and pressure applied to the second diaphragm 21C.

The differential capacitance value Ctotal calculated by the pressure sensor 1 including the pressure sensor chip 20 described above, and a differential capacitance value Ctotal' calculated by a pressure sensor (not illustrated) including a pressure sensor chip 120 of a comparative example were compared by simulation.

Figure 8:
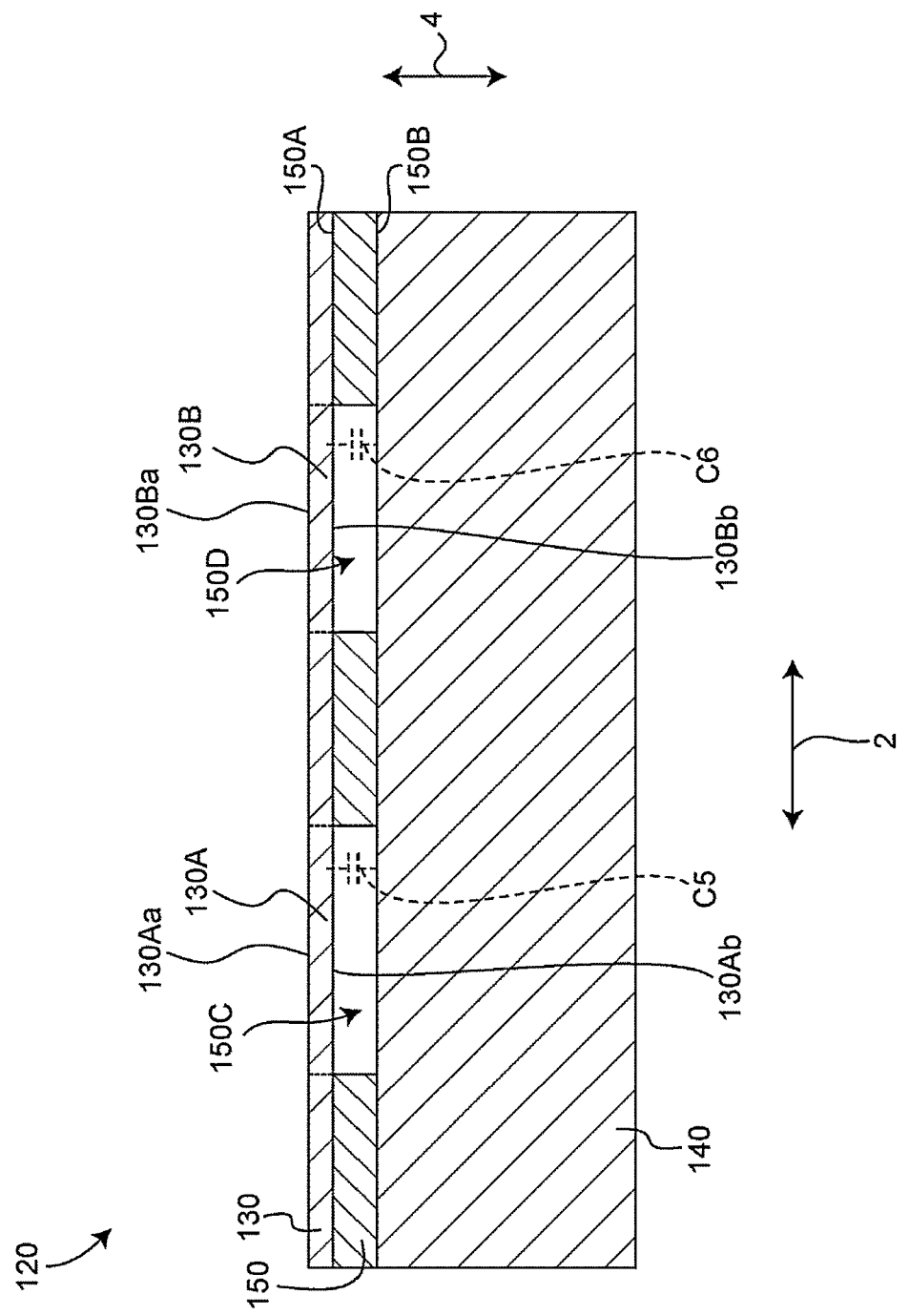
FIG. 8 is a longitudinal sectional view of a pressure sensor chip of a comparative example.

FIG. 8 is a longitudinal sectional view of the pressure sensor chip of the comparative example.

The pressure sensor chip 120 of the comparative example includes a conductive layer 130, a base portion 140, and an insulating layer 150. The conductive layer 130 and the base portion 140 are conductors. The insulating layer 150 is an electrically insulated insulator. The conductive layer 130 is joined to an upper surface 150A of the insulating layer 150. The base portion 140 is joined to a lower surface 150B of the insulating layer 15. Cavities 150C and 150D are provided in the insulating layer 150. A portion of the conductive layer 130 and a portion of the base portion 140 that sandwich the cavity 150C define a capacitor C5 that is indicated by broken lines in FIG. 8 in a pseudo manner. A portion of the conductive layer 130 and a portion of the base portion 140 that sandwich the cavity 150D define a capacitor C6 that is indicated by broken lines in FIG. 8 in a pseudo manner. In the conductive layer 130, the portion defining the capacitor C5 is a first diaphragm 130A, and the portion defining the capacitor C6 is a second diaphragm 130B. In FIG. 8, the first diaphragm 130A and the second diaphragm 130B are each a portion sandwiched between two broken lines.

The pressure sensor chip 120 is covered, similarly to the pressure sensor chip 20, by a covering portion (not illustrated). Two cavities (not illustrated) are provided in the covering portion through which the conductive layer 130 of the pressure sensor chip 120 communicates externally. Through one of the two cavities, the first diaphragm 130A communicates with an outside of the pressure sensor chip 120. Further, the one of the two cavities communicates with the cavity 150D of the insulating layer 150. Through another of the two cavities, the second diaphragm 130B communicates with the outside of the pressure sensor chip 120. Further, the other of the two cavities communicates with the cavity 150C of the insulating layer 150.

In the pressure sensor chip 120 configured as described above, when the above pressure P1 is applied to an upper surface 130Aa of the first diaphragm 130A, and the above pressure P2 is applied to a lower surface 130Ab of the first diaphragm 130A, the above pressure P2 is applied to an upper surface 130Ba of the second diaphragm 130b, and the above pressure P1 is applied to a lower surface 130Bb of the second diaphragm 130B. Further, the differential capacitance value Ctotal' of the pressure sensor chip 120 is calculated by Cb'−Ca'. Ca' is a capacitance value of the capacitor C5, and Cb' is a capacitance value of the capacitor C6.

Figure 9:
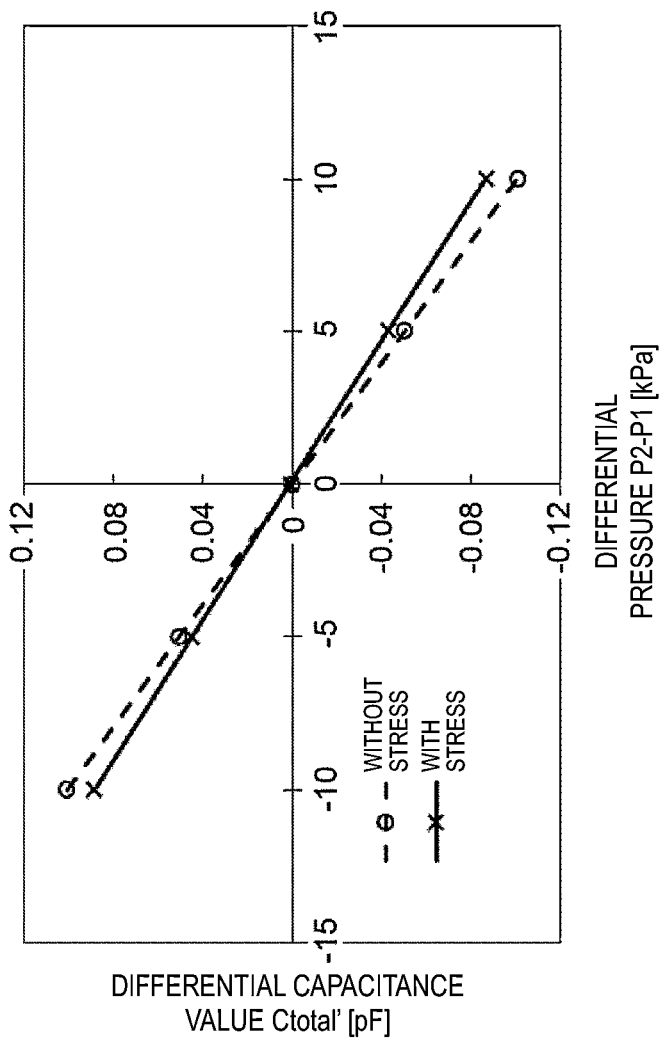
FIG. 9 is a graph showing a simulation result of the comparative example.

FIG. 9 is a graph showing a simulation result of the comparative example. The graph of FIG. 9 shows the differential capacitance value Ctotal' corresponding to a differential pressure (P2−P1) between the pressure P1 and the pressure P2 applied to the pressure sensor chip 120. A broken line in the graph of FIG. 9 indicates characteristics when stress is not applied. A solid line in the graph of FIG. 9 indicates characteristics when stress is applied.

As illustrated in FIG. 9, as a difference between the pressure P1 and the pressure P2 increases, separation of the differential capacitance value Ctotal' of characteristics of the solid line from the differential capacitance value Ctotal' of characteristics of the broken line increases. That is, the fact that as the difference between the pressure P1 and the pressure P2 increases, the separation of the differential capacitance value Ctotal' of characteristics of the solid line from the differential capacitance value Ctotal' of the characteristics of the broken line increases indicates that as the difference between the pressure P1 and the pressure P2 increases, influence of stress received by the first diaphragm 130A and the second diaphragm 130B increases. The influence of the stress received by the first diaphragm 130A and the second diaphragm 130B results in an error in the differential capacitance value Ctotal'. That is, as the difference between the pressure P1 and the pressure P2 increases, an error of the differential capacitance value Ctotal' of the pressure sensor chip 120 increases.

Figure 10:
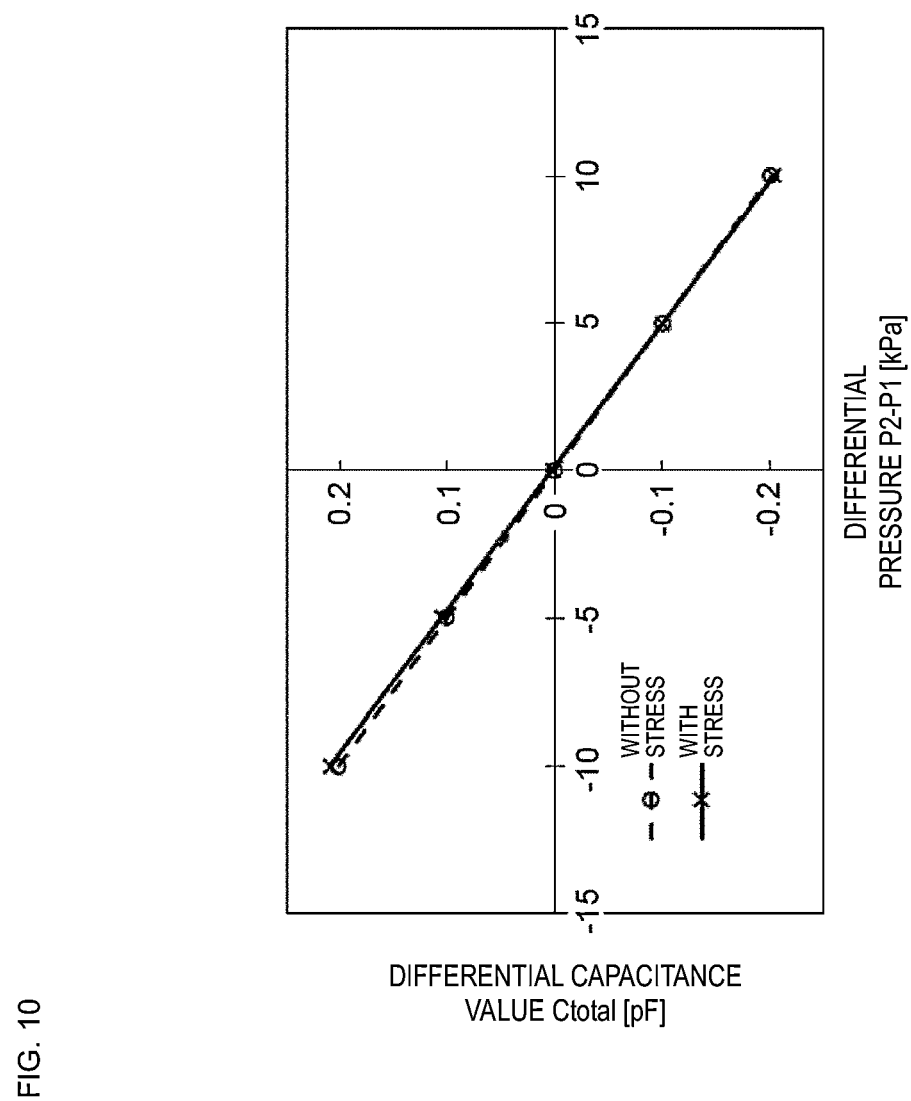
FIG. 10 is a graph showing a simulation result of the first preferred embodiment of the present invention.

FIG. 10 is a graph showing a simulation result of the first preferred embodiment. The graph of FIG. 10 shows the differential capacitance value Ctotal corresponding to a differential pressure (P2−P1) between the pressure P1 and the pressure P2 applied to the pressure sensor chip 20. A broken line in the graph of FIG. 10 indicates characteristics when stress is not applied. A solid line in the graph of FIG. 10 indicates characteristics when stress is applied.

As illustrated in FIG. 10, as the difference between the pressure P1 and the pressure P2 increases, separation of the differential capacitance value Ctotal of characteristics of the solid line from the differential capacitance value Ctotal of characteristics of the broken line increases. However, a width of the separation in FIG. 10 is smaller than a width of the separation in FIG. 9. This indicates that the influence of stress received by the pressure sensor chip 20 of the first preferred embodiment is smaller than the influence of stress received by the pressure sensor chip 120 of the comparative example. As a result, an error of the differential capacitance value Ctotal of the pressure sensor chip 20 of the first preferred embodiment is smaller than an error of the differential capacitance value Ctotal' of the pressure sensor chip 120 of the comparative example. That is, the pressure sensor chip 20 of the first preferred embodiment can detect the differential pressure between the pressure P1 and the pressure P2 with high accuracy as compared to the pressure sensor chip 120 of the comparative example.

According to the first preferred embodiment, the four capacitance values Ca, Cb, Cc, and Cd defined by the capacitors C1, C2, C3, and C4 defined by the respective cavities 24B, 24C, 25B, and 25C. By adding the capacitance values Ca and Cd of the respective cavities 24B and 25C communicating with each other by the first flow path 71, it is possible to detect a capacitance value (first capacitance value) corresponding to the pressure P1 applied from outside via the through-hole 22Ba. Similarly, by adding the capacitance values Cb and Cc of the respective cavities 24C and 25B communicating with each other by the second flow path 72, it is possible to detect a capacitance value (second capacitance value) corresponding to the pressure P2 applied from outside via the through-hole 22Ca. Based on a difference between the first capacitance value and the second capacitance value, the differential pressure between the pressure P1 and the pressure P2 can be obtained.

Pressure applied from outside to the first diaphragm 21B of the first conductive layer 21 via the cavity 24B is applied from above (from a side of the first insulating layer 24). On the other hand, pressure applied from outside to the second diaphragm 21C of the first conductive layer 21 via the cavity 25C is applied from below (from a side of the second insulating layer 25). Here, stress that is applied to the first conductive layer 21 due to warpage or the like includes a compressive stress and a tensile stress. One of the compressive stress and the tensile stress is applied to the upper surface of the first conductive layer 21, and another of the compressive stress and the tensile stress is applied to the lower surface of the first conductive layer 21. Thus, the capacitance value Ca of the cavity 24B is influenced by the one of the compressive stress and the tensile stress, and the capacitance value Cd of the cavity 25C is influenced by the other of the compressive stress and the tensile stress. Thus, when the capacitance value Ca of the cavity 24B and the capacitance value Cd of the cavity 25C are added, at least a portion of the stress (the compressive stress and the tensile stress) influencing the respective capacitance values is cancelled.

Also, for the cavities 24C and 25B, similarly to the cavities 24B and 25C, the capacitance value Cb of the cavity 24C is influenced by one of the compressive stress and the tensile stress, and the capacitance value Cc of the cavity 25B is influenced by another of the compressive stress and the tensile stress. Thus, when the capacitance value Cb of the cavity 24C and the capacitance value Cc of the cavity 25B are added, at least a portion of the stress (the compressive stress and the tensile stress) influencing the respective capacitance values is canceled.

As a result, since the influence of the stress applied to the first conductive layer 21 can be reduced, an error of a detected capacitance value can be reduced.

According to the first preferred embodiment, in plan view, the first diaphragm 21B and the second diaphragm 21C have the same or substantially the same area. Further, the thickness of the first insulating layer 24 and the thickness of the second insulating layer 25 are the same or substantially the same. Accordingly, variations in the influence of the stress affecting the capacitance values Ca, Cb, Cc, and Cd of the respective cavities 24B, 24C, 25B, and 25C are reduced. Thus, it is possible to increase an amount of cancellation of the stress.

According to the first preferred embodiment, it is possible to detect the capacitance values Ca, Cb, Cc, and Cd of the respective cavities 24B, 24C, 25B, and 25C, based on values of currents flowing through the respective pads 29A to 29E and values of voltages applied between the pads.

According to the first preferred embodiment, the first flow path 71 and the second flow path 72 can be provided simply by providing the through-hole in the first conductive layer 21 and providing the space in each of the first insulating layer 24 and the second insulating layer 25. That is, the first flow path 71 and the second flow path 72 can be provided without requiring a complicated configuration or a complicated manufacturing process.

According to the first preferred embodiment, the cavities 24B and 24C can be made to communicate with the outside of the pressure sensor chip 20 only by providing the through-hole in the second conductive layer 22, that is, without requiring a complicated configuration.

According to the first preferred embodiment, in the pressure sensor 1 including the pressure sensor chip 20, it is possible to cancel at least a portion of the stress (the compressive stress and the tensile stress) influencing each of them.

In the first preferred embodiment, of the cavities 24B and 25C communicating with each other, the cavity 24B communicates with the outside of the pressure sensor chip 20. In addition, in the first preferred embodiment, of the cavities 24C and 25B communicating with each other, the cavity 24C communicates with the outside of the pressure sensor chip 20. That is, in the first preferred embodiment, the cavities 24B and 24C provided in the first insulating layer 24 communicate with the outside of the pressure sensor chip 20.

However, the cavities 25B and 25C provided in the second insulating layer 25 may communicate with the outside of the pressure sensor chip 20. In this case, a flow path through which the cavity 25B communicates with the outside of the pressure sensor chip 20, and a flow path through which the cavity 25C communicates with the outside of the pressure sensor chip 20 are provided in the pressure sensor chip 20. For example, the above flow paths extend from the respective cavities 25B and 25C, to the outside of the pressure sensor chip 20, through the second insulating layer 25, the first conductive layer 21, the first insulating layer 24, and the second conductive layer 22. In the case of the above example, the flow path through which the cavity 25C and the outside of the pressure sensor chip 20 communicate with each other corresponds to the first communication portion. In addition, the flow path through which the cavity 25B and the outside of the pressure sensor chip 20 communicate with each other corresponds to the second communication portion.

Further, both of the cavities 24B and 25C may communicate with the outside of the pressure sensor chip 20, or both of the cavities 24C and 25B may communicate with the outside of the pressure sensor chip 20.

In the first preferred embodiment, the cavity 24B and the cavity 25C communicate with each other through the first flow path 71 as illustrated in FIG. 2 and FIG. 3, and the cavity 24C and the cavity 25B communicate with each other through the second flow path 72 as illustrated in FIG. 2 and FIG. 3. However, it is not limited to the first flow path 71 and the second flow path 72 as illustrated in FIG. 2 and FIG. 3 that make the cavities 24B and 25C communicate with each other and the cavities 24C and 25B communicate with each other.

For example, the flow path through which the cavities 24B and 25C communicate with each other, and the flow path through which the cavities 24C and 25B communicate with each other may pass through the base portion 28.

Further, for example, the flow path through which the cavities 24B and 25C communicate with each other, and the flow path through which the cavities 24C and 25B communicate with each other may pass through the outside of the pressure sensor chip 20. In this case, each of the cavities 24B, 24C, 25B, and 25C communicates with the outside of the pressure sensor chip 20 by a through-hole or the like, and two through-holes corresponding to the cavities 24B and 25C are connected to each other by a pipe or the like. Further, two through-holes corresponding to the cavities 24C and 25B are connected to each other by a pipe or the like.

Second Preferred Embodiment

In the first preferred embodiment, the pressure sensor chip 20 includes the five pads 29A to 29E. The pad 29A is electrically connected to the first diaphragm 21B and the second diaphragm 21C. The pads 29B, 29C, 29D, and 29E are electrically connected to the electrodes 22B, 22C, 23B, and 23C, respectively. However, the number of pads included in the pressure sensor chip 20 is not limited to five. Further, a combination of connection between the respective pads and the first diaphragm 21B, the second diaphragm 21C, and the electrodes 22B, 22C, 23B, and 23C is not limited to the combination of connection described in the first preferred embodiment.

Figure 11:
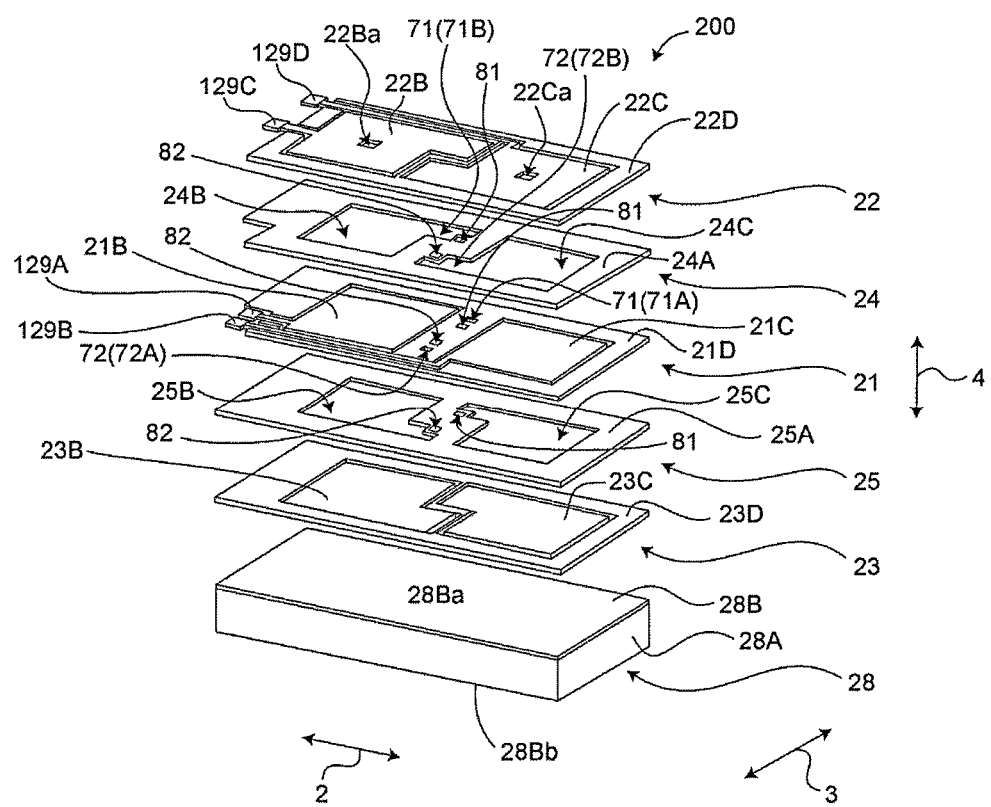
FIG. 11 is an exploded perspective view of a pressure sensor chip included in a pressure sensor according to a second preferred embodiment of the present invention.

FIG. 11 is an exploded perspective view of a pressure sensor chip included in a pressure sensor according to a second preferred embodiment of the present invention. A pressure sensor chip 200 of the pressure sensor according to the second preferred embodiment differs from the pressure sensor chip 20 of the pressure sensor 1 according to the first preferred embodiment in that the pressure sensor chip 200 includes four pads 129A to 129D.

As illustrated in FIG. 11, the pressure sensor chip 200 includes the pads 129A to 129D instead of the pads 29A to 29E.

The pad 129A is electrically connected to the first diaphragm 21B. The pad 129B is electrically connected to the second diaphragm 21C. The first diaphragm 21B and the second diaphragm 21C are not electrically connected to each other. The pads 129A and 129B are supported by the upper surface 25A of the second insulating layer 25. The pad 129A is an example of a third pad. The pad 129B is an example of a fourth pad.

The pad 129C is electrically connected to the electrode 22B. The pad 129D is electrically connected to the electrode 22C. The pads 129C and 129D are supported by the upper surface 24A of the first insulating layer 24.

The pressure sensor 200 includes vias 81 and 82. Both of the vias 81 and 82 are through-holes passing through the first insulating layer 24, the first conductive layer 21, and the second insulating layer 25. The vias 81 and 82 are filled with conductors. An upper end portion of the via 81 is connected to the electrode 22B. A lower end portion of the via 81 is connected to the electrode 23C. Thus, the electrodes 22B and 23C are electrically connected to each other through the via 81. An upper end portion of the via 82 is connected to the electrode 22C. A lower end portion of the via 82 is connected to the electrode 23B. Thus, the electrodes 22C and 23B are electrically connected to each other through the via 82.

As described above, the pad 129C is electrically connected to the electrodes 22B and 23C. The pad 129C is an example of a first pad. The pad 129D is electrically connected to the electrodes 22C and 23B. The pad 129D is an example of a second pad.

Figure 12:
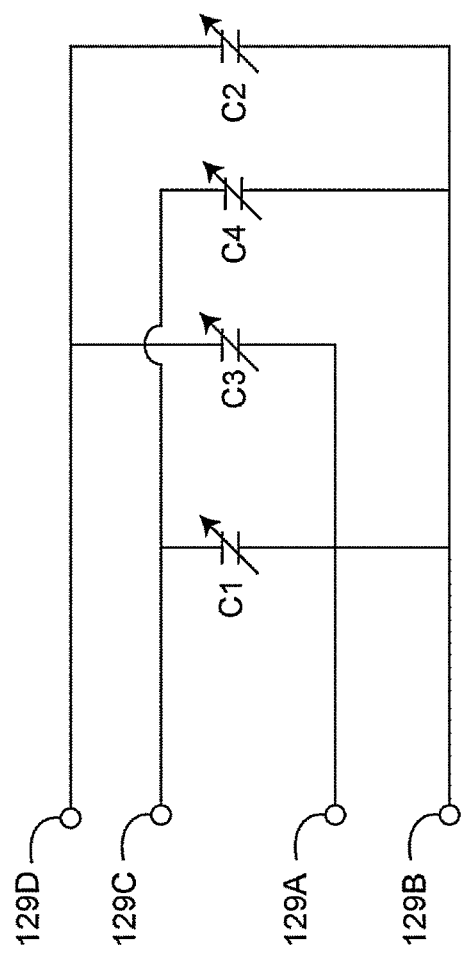
FIG. 12 is a diagram illustrating an equivalent circuit of the pressure sensor chip of FIG. 11.

FIG. 12 is a diagram illustrating an equivalent circuit of the pressure sensor chip of FIG. 11. Also, in the case of the second preferred embodiment, similarly to the case of the first preferred embodiment, the differential capacitance value Ctotal can be calculated from the capacitance values of the respective capacitors C1 to C4, based on the equation $(Cb+Cc)-(Ca+Cd)=Ctotal$. Further, a simulation result is similar to that in the first preferred embodiment. That is, the pressure sensor chip 200 of the second preferred embodiment can detect a differential pressure between the pressure P1 and the pressure P2 with high accuracy as compared to the pressure sensor chip 120 of the comparative example.

According to the second preferred embodiment, it is possible to detect the capacitance values Ca, Cb, Cc, and Cd of the respective cavities 24B, 24C, 25B, and 25C, based on values of currents flowing through the respective pads 129A to 129D and values of voltage applied between the pads. Further, according to the second preferred embodiment, since one pad is connected to two electrodes, it is possible to reduce the number of electrodes, as compared to the first preferred embodiment in which one pad is connected to one electrode.

Third Preferred Embodiment

Figure 13:
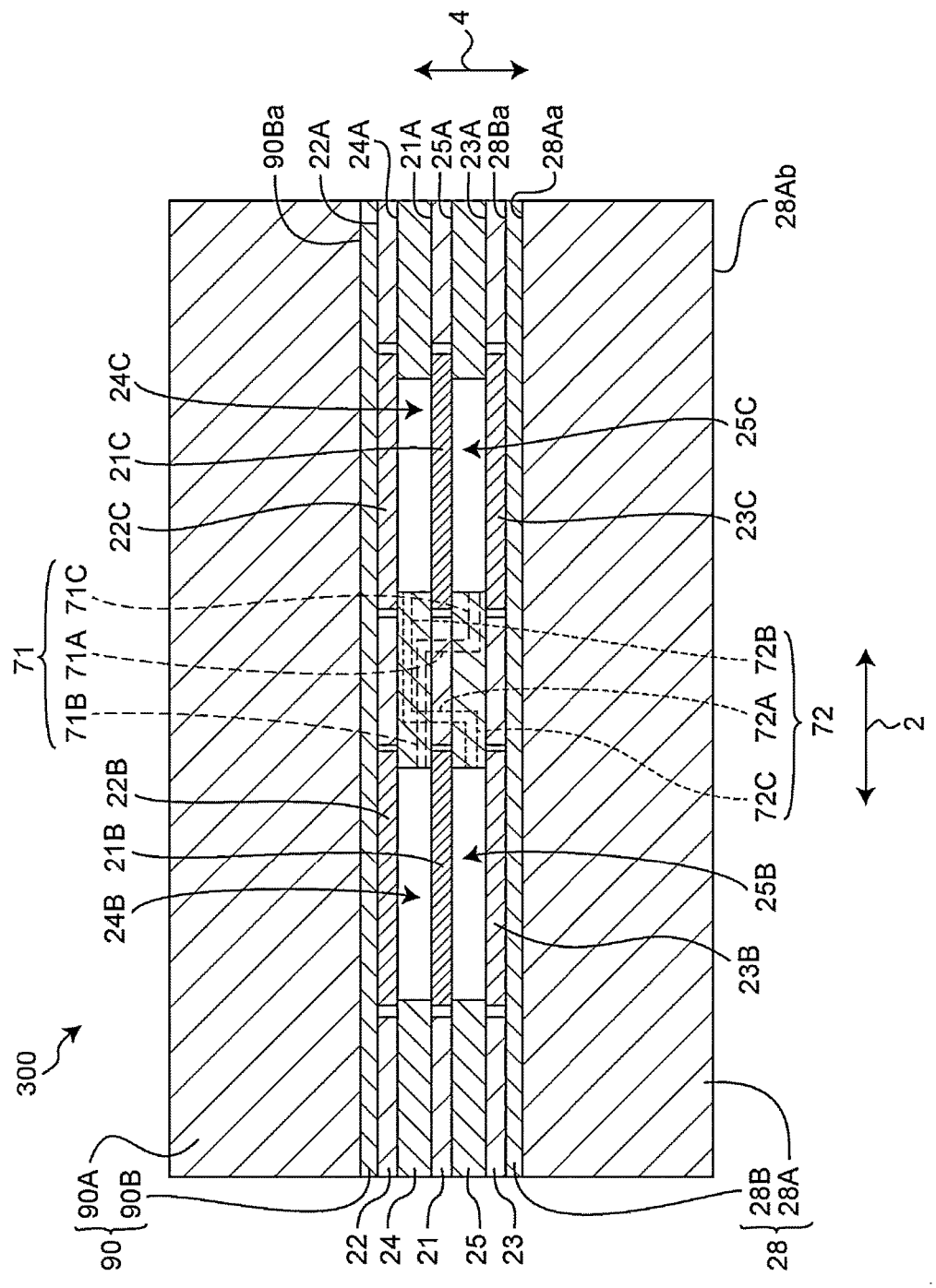
FIG. 13 is a longitudinal sectional view of a pressure sensor chip included in a pressure sensor according to a third preferred embodiment of the present invention.

FIG. 13 is a longitudinal sectional view of a pressure sensor chip included in a pressure sensor according to a third preferred embodiment of the present invention. A pressure sensor chip 300 of the pressure sensor according to the third preferred embodiment is different from the pressure sensor chip 20 of the pressure sensor 1 according to the first preferred embodiment in that a base portion 90 is included. In other words, the pressure sensor chip 300 includes the two base portions 28 and 90.

As illustrated in FIG. 13, the base portion 28 is joined to the third conductive layer 23 on an opposite side from the second insulating layer 25. The base portion 90 is joined to the second conductive layer 22 on an opposite side from the first insulating layer 24. In the third preferred embodiment, the base portion 90 is an example of a first base portion, and the base portion 28 is an example of a second base portion.

The base portion 90 includes a conductive layer 90A and an insulating layer 90B. In the third preferred embodiment, the conductive layer 90A is made of, for example, silicon similarly to the conductive layer 28A of the base portion 28, and the insulating layer 90B is made of, for example silicon dioxide similarly to the insulating layer 28B of the base portion 28.

The insulating layer 90B is joined to the upper surface 22A of the second conductive layer 22. The conductive layer 90A is joined to an upper surface 90Ba of the insulating layer 90B.

A configuration of the conductive layer 90A is the same as or similar to the configuration of the conductive layer 28A of the base portion 28. A configuration of the insulating layer 90B is the same as or similar to the configuration of the insulating layer 28B of the base portion 28. For example, thicknesses of the conductive layer 90A and the insulating layer 90B are the same or substantially the same as thicknesses of the conductive layer 28A and the insulating layer 28B, respectively.

As described above, the base portions 28 and 90 are configured to be symmetrical or substantially symmetrical to each other with respect to the first conductive layer 21.

According to the third preferred embodiment, the pressure sensor chip 300 is configured to be symmetrical or substantially symmetrical in a stacking direction (the height direction 4) of the respective layers. Thus, warpage of the pressure sensor chip 300 can be reduced or prevented. As a result, generation of stress in the first conductive layer 21 can be reduced or prevented.

According to the third preferred embodiment, the respective layers (the first conductive layer 21, the second conductive layer 22, the third conductive layer 23, the first insulating layer 24, and the second insulating layer 25) can be shielded by the base portions 28 and 90 including the conductive layers 28A and 90A. Accordingly, since noise to each layer can be reduced, accuracy of the detected capacitance values Ca, Cb, Cc, and Cd is improved.

In the third preferred embodiment, each of the base portions 28 and 90 includes, for example, the two layers, but each of the base portions 28 and 90 only needs to include at least one layer. For example, each of the base portions 28 and 90 may include two insulating layers and three conductive layers.

In the third preferred embodiment, each of the base portions 28 and 90 includes the conductive layer, but only one of the base portions 28 and 90 may include the conductive layer, and another of the base portions 28 and 90 may include only the insulating layer without including the conductive layer. In addition, each of the base portions 28 and 90 may include only the insulating layer without including the conductive layer.

In the third preferred embodiment, the base portions 28 and 90 each include the same number of layers, but the number of layers of the base portion 28 and the number of layers of the base portion 90 may be different from each other. Further, in the third preferred embodiment, the base portions 28 and 90 have the same or substantially the same configuration, but the base portions 28 and 90 may have configurations different from each other. For example, the base portion 28 may include only one insulating layer, and the base portion 90 may include two conductive layers.

By appropriately combining any preferred embodiments among the various preferred embodiments described above, it is possible to achieve the advantageous effects of the respective preferred embodiments.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure sensor chip, comprising:
a first insulating layer including a first cavity and a second cavity, and being electrically insulated;
a second insulating layer including a third cavity and a fourth cavity, and being electrically insulated;
a first conductive layer between the first insulating layer and the second insulating layer;
a second conductive layer joined to the first insulating layer on an opposite side from the first conductive layer;
a third conductive layer joined to the second insulating layer on an opposite side from the first conductive layer;
a first flow path through which the first cavity and the fourth cavity communicate with each other;
a second flow path through which the second cavity and the third cavity communicate with each other;
a first communication portion through which at least one of the first cavity and the fourth cavity communicates externally; and
a second communication portion through which at least one of the second cavity and the third cavity communicates externally; wherein
the first conductive layer includes:
a first diaphragm between the first cavity and the third cavity; and a second diaphragm between the second cavity and the fourth cavity;

the second conductive layer includes:
   a first electrode facing the first diaphragm with the first cavity interposed therebetween; and
   a second electrode facing the second diaphragm with the second cavity interposed therebetween; and the third conductive layer includes:
   a third electrode facing the first diaphragm with the third cavity interposed therebetween; and
   a fourth electrode facing the second diaphragm with the fourth cavity interposed therebetween.

2. The pressure sensor chip according to claim 1, wherein in plan view of the first conductive layer, the first diaphragm and the second diaphragm have a same or substantially a same area.

3. The pressure sensor chip according to claim 1, wherein the first insulating layer and the second insulating layer have a same or substantially a same thickness.

4. The pressure sensor chip according to claim 1, further comprising:
   a first pad electrically connected to the first electrode;
   a second pad electrically connected to the second electrode;
   a third pad electrically connected to the third electrode;
   a fourth pad electrically connected to the fourth electrode; and
   a fifth pad electrically connected to the first diaphragm and the second diaphragm.

5. The pressure sensor chip according to claim 1, further comprising:
   a first pad electrically connected to the first electrode and the fourth electrode;
   a second pad electrically connected to the second electrode and the third electrode;
   a third pad electrically connected to the first diaphragm, and
   a fourth pad electrically connected to the second diaphragm.

6. The pressure sensor chip according to claim 1, wherein the first flow path includes:
   a first through-hole in the first conductive layer;
   a first space in the first insulating layer and communicating with the first through-hole and the first cavity; and
   a second space in the second insulating layer and communicating with the first through-hole and the fourth cavity.

7. The pressure sensor chip according to claim 1, wherein the second flow path includes:
   a second through-hole in the first conductive layer;
   a third space in the first insulating layer and communicating with the second through-hole and the second cavity; and
   a fourth space in the second insulating layer, and communicating with the second through-hole and the third cavity.

8. The pressure sensor chip according to claim 1, wherein the second conductive layer is exposed externally, and includes the first communication portion and the second communication portion.

9. The pressure sensor chip according to claim 1, further comprising:
   a first base portion including at least one layer, and joined to the second conductive layer on an opposite side from the first insulating layer; and
   a second base portion including at least one layer, and joined to the third conductive layer on an opposite side from the second insulating layer; wherein
   the first base portion and the second base portion are symmetrical or substantially symmetrical to each other with respect to the first conductive layer.

10. The pressure sensor chip according to claim 9, wherein at least one of the first base portion and the second base portion includes a conductive layer.

11. A pressure sensor, comprising:
   the pressure sensor chip according to claim 1; and
   a control chip electrically connected to the first electrode, the second electrode, the third electrode, the fourth electrode, the first diaphragm, and the second diaphragm; wherein
   the control chip is configured or programmed to calculate a differential pressure between pressure applied to the first diaphragm and pressure applied to the second diaphragm, based on signals from the first electrode, the second electrode, the third electrode, the fourth electrode, the first diaphragm, and the second diaphragm.

12. The pressure sensor according to claim 11, wherein in plan view of the first conductive layer, the first diaphragm and the second diaphragm have a same or substantially a same area.

13. The pressure sensor according to claim 11, wherein the first insulating layer and the second insulating layer have a same or substantially a same thickness.

14. The pressure sensor according to claim 11, further comprising:
   a first pad electrically connected to the first electrode;
   a second pad electrically connected to the second electrode;
   a third pad electrically connected to the third electrode;
   a fourth pad electrically connected to the fourth electrode; and
   a fifth pad electrically connected to the first diaphragm and the second diaphragm.

15. The pressure sensor according to claim 11, further comprising:
   a first pad electrically connected to the first electrode and the fourth electrode;
   a second pad electrically connected to the second electrode and the third electrode;
   a third pad electrically connected to the first diaphragm, and
   a fourth pad electrically connected to the second diaphragm.

16. The pressure sensor according to claim 11, wherein the first flow path includes:
   a first through-hole in the first conductive layer;
   a first space in the first insulating layer and communicating with the first through-hole and the first cavity; and
   a second space in the second insulating layer and communicating with the first through-hole and the fourth cavity.

17. The pressure sensor according to claim 11, wherein the second flow path includes:
   a second through-hole in the first conductive layer;
   a third space in the first insulating layer and communicating with the second through-hole and the second cavity; and
   a fourth space in the second insulating layer, and communicating with the second through-hole and the third cavity.

18. The pressure sensor according to claim 11, wherein the second conductive layer is exposed externally, and includes the first communication portion and the second communication portion.

19. The pressure sensor according to claim 11, further comprising:
   a first base portion including at least one layer, and joined to the second conductive layer on an opposite side from the first insulating layer; and
   a second base portion including at least one layer, and joined to the third conductive layer on an opposite side from the second insulating layer; wherein
   the first base portion and the second base portion are symmetrical or symmetrical to each other with respect to the first conductive layer.

20. The pressure sensor according to claim 19, wherein at least one of the first base portion and the second base portion includes a conductive layer.

* * * * *